United States Patent
Araki et al.

[11] Patent Number: 5,855,711
[45] Date of Patent: Jan. 5, 1999

[54] METHOD OF PRODUCING A CERAMIC CIRCUIT SUBSTRATE

[75] Inventors: Hideaki Araki; Masashi Fukaya, both of Mine, Japan

[73] Assignee: Sumitomo Metal (SMI) Electronics Devices Inc., Mine, Japan

[21] Appl. No.: 824,095

[22] Filed: Mar. 25, 1997

[30] Foreign Application Priority Data

Mar. 28, 1996 [JP] Japan .................................. 8-103606

[51] Int. Cl.⁶ .................................................. B32B 31/26
[52] U.S. Cl. ...................... 156/89.16; 156/277; 29/851; 264/619; 264/620
[58] Field of Search ........................... 156/89, 277, 344, 156/289; 264/619, 620; 29/851

[56] References Cited

U.S. PATENT DOCUMENTS

| | | | |
|---|---|---|---|
| 5,085,720 | 2/1992 | Mikeska et al. | 156/89 |
| 5,130,067 | 7/1992 | Flaitz et al. | 156/89 X |
| 5,254,191 | 10/1993 | Mikeska et al. | 156/89 |
| 5,370,759 | 12/1994 | Hakotani et al. | 156/89 X |
| 5,387,474 | 2/1995 | Mikeska et al. | 156/89 X |
| 5,456,778 | 10/1995 | Fukuta et al. | 156/89 |
| 5,470,412 | 11/1995 | Fukuta et al. | 156/89 |
| 5,474,741 | 12/1995 | Mikeska et al. | 156/89 X |

*Primary Examiner*—Curtis Mayes
*Attorney, Agent, or Firm*—Oblon, Spivak, McClelland, Maier & Neustadt, P.C.

[57] ABSTRACT

A ceramic circuit substrate providing a circuit pattern with a fine line as well as high accuracy for positioning the circuit pattern and a method of producing the ceramic circuit substrate. An alumina layer that is green containing an alumina that is not sintered at a temperature ranging from 800° to 1000° C. is applied on a surface of a ceramic green sheet containing glass and then fired at a temperature ranging from 800° to 1000° C. The ceramic green sheet is sintered into a sintered ceramic substrate. A porous alumina layer is formed on a surface of the sintered ceramic substrate. The glass contained in the sintered ceramic substrate is caused to flow to the inside of the porous alumina layer so that the part of the porous alumina layer filled with the glass is bonded to the sintered ceramic substrate. The part of the porous alumina layer not filled with the glass is removed, wherein the porous alumina layer remaining on the sintered ceramic substrate after the removing has a thickness of 10 μm or less. A paste for forming the circuit pattern is printed on a surface of the part of the porous alumina layer that has been bonded to the sintered ceramic substrate for heating.

4 Claims, 9 Drawing Sheets

METHOD OF PRODUCING A CERAMIC CIRCUIT SUBSTRATE

BACKGROUND OF THE INVENTION

1. Field of the Invention

The present invention relates to a ceramic circuit substrate and a method of producing the ceramic circuit substrate. More specifically the present invention relates to adhesion of a circuit pattern to a surface of a sintered ceramic substrate.

2. Description of the Related Arts

A multilayer ceramic substrate has been proposed accompanied with the need demanding to reduce the size of the ceramic circuit substrate and to further enhance its density to be higher. Particularly a glass ceramic multilayer substrate that can be sintered at a low temperature ranging from 800° to 1000° C. has been highly expected to cope with the above-described need, which is allowed to contain low conductive resistance such as Ag, Cu or the like as an inner layer.

As an initial step of producing the above ceramic circuit substrate, via holes 921 are pierced through a plurality of ceramic green sheets 920 as FIG. 11 shows. Then the via hole 921 is filled with a conductor 951. A paste 952 for forming an inner layer pattern is printed on a surface of the ceramic green sheet 920. Those ceramic green sheets 920 are laminated and co-fired. As a result, a sintered ceramic substrate 92 having an inner layer pattern 95 and the conductive via hole 921 is obtained as FIG. 12 shows.

As FIG. 13 shows, a paste 932 for forming the circuit pattern is printed on a surface of the sintered ceramic substrate 92 for firing again. A circuit pattern 93 is formed on the surface of the sintered ceramic substrate 92, resulting in providing a ceramic circuit substrate 9 having a multilayer construction as shown in FIG. 14. The method of producing the ceramic circuit substrate as described above uses porous ceramic green sheets 920 as shown in FIG. 15 that serve to absorb solvent 959 contained in the paste 952 easily. When printing the paste 952 for forming the inner layer pattern to the above-featured ceramic green sheet 920, the ceramic green sheet 920 absorbs the solvent 959 contained in the paste 952. Therefore stain and bleed hardly occurs after printing, thus forming the inner layer pattern with a sharp and fine line.

On the contrary as shown in FIG. 16, it is difficult for the sintered ceramic substrate 92 obtained by co-firing the ceramic green sheets to absorb the solvent contained in the paste 932 for forming the circuit pattern sufficiently. In case of printing the paste 932 to the surface of the sintered ceramic substrate 92, most of the solvent cannot be absorbed thereby. As a result, the paste 932 that has been printed is likely to flow to the outside of a specified dimension 930 immediately after printing, resulting in a stain 939. Or the solvent may bleed on the surface of the paste 932, thus causing a bleed 938. Due to the above described stain or bleed, the fine line cannot be formed. Failing to form the fine line may obstruct the effort to reduce the size of the ceramic circuit substrate and to enhance its density to be higher.

Forming an outermost circuit pattern on a ceramic green sheet in the same manner as forming the inner layer pattern has been proposed. This process, however, causes variation in shrinkage among ceramic green sheets at firing. This deteriorates the accuracy for positioning the circuit pattern, obstructing the mount of a part to the circuit pattern.

SUMMARY OF THE INVENTION

An objective of the present invention is to provide a ceramic circuit substrate having the circuit pattern with fine lines and allowing for accurate positioning of the circuit pattern and a method of producing such ceramic circuit substrate.

The present invention provides a method of producing a ceramic circuit substrate comprising steps of: preparing a laminated body by applying an alumina layer that is green containing an alumina that is not sintered at a temperature ranging from 800° to 1000° C. to a surface of a ceramic green sheet containing glass that is sintered at a temperature ranging from 800° to 1000° C.; forming a sintered ceramic substrate by sintering the ceramic green sheet and forming the alumina layer into a porous alumina layer through firing the laminated body at a temperature ranging from 800° to 1000° C.; and causing the glass to flow into the porous alumina layer so as to bond a part of the porous alumina layer filled with the glass to the sintered ceramic substrate; removing an alumina part of the porous alumina layer that has not been bonded to a surface of the sintered ceramic substrate, wherein the porous alumina layer remaining on the sintered ceramic substrate after the removing has a thickness of 10 $\mu$m or less; printing a paste for forming a circuit pattern on a surface of the porous alumina layer; and adhering the circuit pattern to the sintered ceramic substrate with the aide of the porous alumina layer by firing the sintered ceramic substrate.

Other objectives and aspects of the invention will become more apparent from the following description of examples with reference to the accompanying figures.

DETAILED DESCRIPTION OF THE INVENTION

Figure 1:
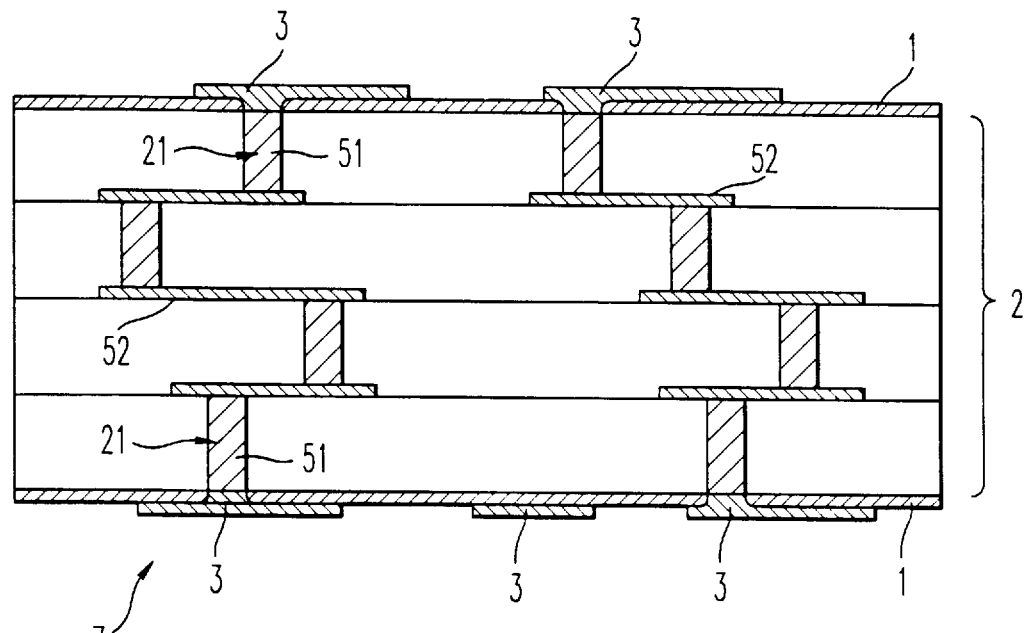
FIG. 1 is a cross section of a ceramic circuit substrate of Example 1.

The present invention is characterized by a method of producing a ceramic circuit substrate comprising steps of: preparing a laminated body by applying an alumina layer that is green containing an alumina that is not sintered at a temperature ranging from 800° to 1000° C. to a surface of a ceramic green sheet containing glass that is sintered at a temperature ranging from 800° to 1000° C.; forming a sintered ceramic substrate by sintering the ceramic green sheet and forming the alumina layer into a porous alumina layer through firing the laminated body at a temperature ranging from 800° to 1000° C.; and causing the glass to flow into the porous alumina layer so as to bond a part of the porous alumina layer filled with the glass to the sintered ceramic substrate; removing an alumina part of the porous alumina layer that has not been bonded to a surface of the sintered ceramic substrate; printing a paste for forming a circuit pattern on a surface of the porous alumina layer; and adhering the circuit pattern to the sintered ceramic substrate with the aid of the porous alumina layer by firing the sintered ceramic substrate.

The most important feature of the present invention is that the circuit pattern is formed on a surface of the sintered ceramic substrate with the aid of a porous alumina layer after firing.

An advantageous effect of the above described method is explained.

A laminated body formed of ceramic green sheets containing glass and an alumina layer that is green containing an alumina that is not sintered at a temperature ranging from 800° to 1000° C. is sintered at a temperature ranging from 800° to 1000° C. The ceramic green sheets are sintered to form the sintered ceramic substrate. While the alumina layer is not sintered and then becomes a porous alumina layer having a large number of pores formed among particle-like aluminas.

The glass contained in the sintered ceramic substrate is melted and flows into pores of the porous alumina layer through capillary phenomenon. The specific part of the porous alumina layer into which the glass has been entered is bonded to the sintered ceramic substrate.

If the temperature for firing the aforementioned laminated body is less than 800° C., the ceramic green sheets are not sintered and the glass contained therein is not melted. While if the temperature for firing the laminated body exceeds 1000° C., a conductor material having a low melting point such as Ag or the like cannot be used.

The bonded part of the alumina layer bonded to the sintered ceramic substrate is only remained by removing the non-bonded part that is not bonded thereto. In case of printing the circuit pattern without removing the non-bonded part, the non-bonded part is likely to break during manufacturing or use of the ceramic circuit substrate, thus preventing the circuit pattern from being adhered to the sintered ceramic substrate.

The non-bonded part of the alumina is not sintered even when it is fired at a temperature ranging from 800° to 1000° C. It is formed into a powder after a resin contained in the alumina layer is decomposed and dispersed, which can be easily removed.

A paste for forming the circuit pattern is printed on a surface of the bonded part of the porous alumina layer. The glass has entered into many pores formed among the particle-like aluminas. However all pores are not filled with the glass. Therefore sufficient amount of the solvent contained in the paste can be absorbed by those pores that have not been filled with the glass.

When printing the paste on a surface of the porous alumina layer, the solvent contained in the paste is absorbed thereby, thus forming a sharp and fine circuit pattern.

When the above obtained sintered ceramic substrate is fired, the glass contained in the paste for forming the circuit pattern is melted and flows into the inside of the porous alumina layer. The circuit pattern can be adhered to the porous alumina layer owing to the anchor effect of the glass entering thereinto.

As described above, the glass contained in the sintered ceramic substrate is so designed to flow into the porous alumina layer from one surface. On the contrary the glass contained in the circuit pattern is designed to flow into the porous alumina layer from the other surface thereof. The porous alumina layer and the sintered ceramic substrate can be strongly adhered. Likewise the porous alumina layer and the circuit pattern can be strongly adhered as well.

The resultant ceramic circuit substrate has a sharp and fine circuit pattern as well as firmly adhering the circuit pattern to the sintered ceramic substrate.

As the circuit pattern is printed to the sintered ceramic substrate that has been fired, the sintered ceramic substrate never shrinks even after forming the circuit pattern. The circuit pattern, thus, can be printed at the exact position accurately.

An alumina sheet can be used as the alumina layer. Alternatively such material obtained by drying the printed alumina paste can be used as the alumina layer.

It is preferable that the laminated body is thermocompressed before firing. As the alumina layer can be tightly adhered to the ceramic green sheet, the part of the porous alumina layer filled with the glass is well bonded to the sintered ceramic substrate during firing without applying pressure to the laminated body.

Upon printing of the paste for forming the circuit pattern, it is preferable that the porous alumina layer with the non-bonded alumina already removed has a thickness of 10 $\mu$m or less. If the thickness exceeds 10 $\mu$m, the adhesion between the sintered ceramic substrate and the circuit pattern may be deteriorated.

It is further preferable that the above thickness is less than 3 $\mu$m so as to enhance adhesion between the sintered ceramic substrate and the circuit pattern.

It is preferable that the thickness of the above porous alumina layer is not less than 0.5 $\mu$m. If the thickness is less than 0.5 $\mu$m, sufficient amount of the solvent cannot be absorbed by the porous alumina layer, thus failing to form the sharp and fine circuit pattern.

It is preferable that the paste for forming the circuit pattern contains glass frit. In the firing after printing the paste, the glass contained in the paste will be melted and flow into pores of the porous alumina layer. Therefore the circuit pattern is firmly adhered to the sintered ceramic substrate.

It is preferable to buff a surface of the porous alumina layer after removing the non-bonded part for smoothing.

The paste for forming the circuit pattern is a material obtained by mixing a solid material formed of, for example, conductor, resistor or glass with binder and solvent.

The conductor is prepared by mixing a small amount of glass with a conductor such as Au, Ag/Pd, Ag/Pt, Ag or the like. The resistor is prepared by mixing, for example, ruthenium oxide with glass.

The sintered ceramic substrate is sintered at the same temperature for firing a thick film in a conventional manner. The temperature for firing the conductor and the resistor ranges from, for example, 800° to 900° C. The temperature for firing the glass ranges from, for example, 500° to 900° C.

The ceramic circuit substrate produced by the above method comprises a sintered ceramic substrate containing glass and a circuit pattern applied on a surface of the sintered ceramic substrate. A porous alumina layer is formed between the sintered ceramic substrate and the circuit pattern and an inside of the porous alumina layer is filled with glass that has been contained both in the circuit pattern and the sintered ceramic substrate.

In a process of producing the above-described ceramic circuit substrate, the glass contained in the sintered ceramic substrate flows to the inside of the porous alumina layer from one surface. On the contrary the glass contained in the circuit pattern also flows to the inside of the porous alumina layer from the other surface. Therefore the porous alumina layer and the sintered ceramic substrate can be firmly adhered. Likewise the porous alumina layer and the circuit pattern can also be firmly adhered.

As the solvent contained in the paste for forming the circuit pattern is absorbed by the porous alumina layer, the sharp circuit pattern exhibiting no bleed nor stain can be formed. The resultant circuit pattern presents fineness and high accuracy.

It is preferable that the thickness of the porous alumina layer is 10 $\mu$m or less. If it exceeds 10 $\mu$m, adhesion between the sintered ceramic substrate and the circuit pattern may be deteriorated. It is preferable that the thickness of the porous alumina layer is 3 $\mu$m or less for further enhancing the adhesion. It is preferable that the thickness of the porous alumina layer is not less than 0.5 $\mu$m so as to form finer and sharper circuit pattern.

The present invention provides a ceramic circuit substrate realizing a fine and sharp circuit pattern and having capability to position the circuit pattern accurately and the method of producing such ceramic circuit substrate.

EXAMPLES

Example 1

Figure 10:
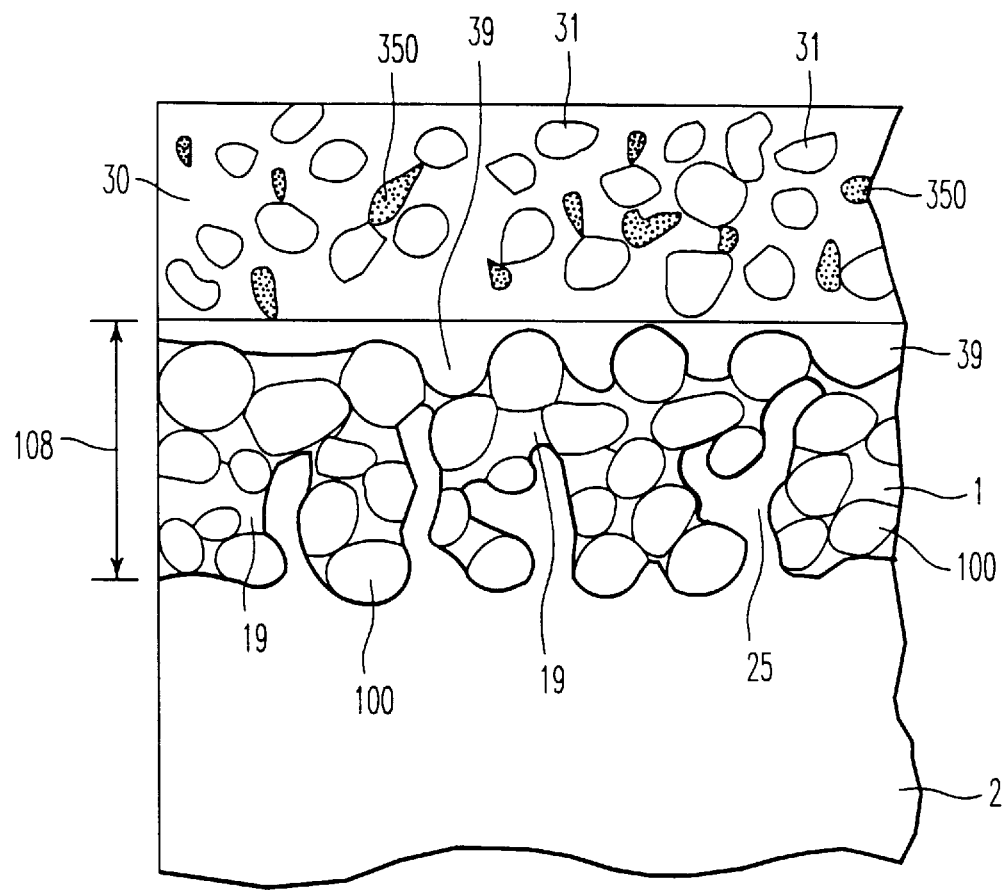
FIG. 10 is a cross section of upper surface of the sintered ceramic substrate after printing the paste for forming the circuit pattern onto the porous alumina layer surface in Example 1.
Figure 11:
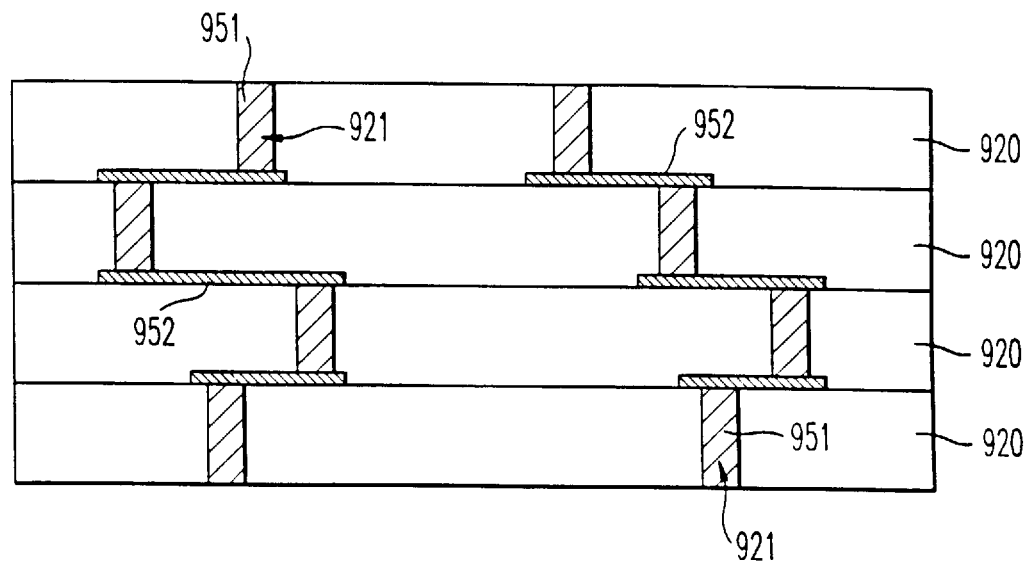
FIG. 11 is a cross section of laminated ceramic green sheets of a prior art.
Figure 12:
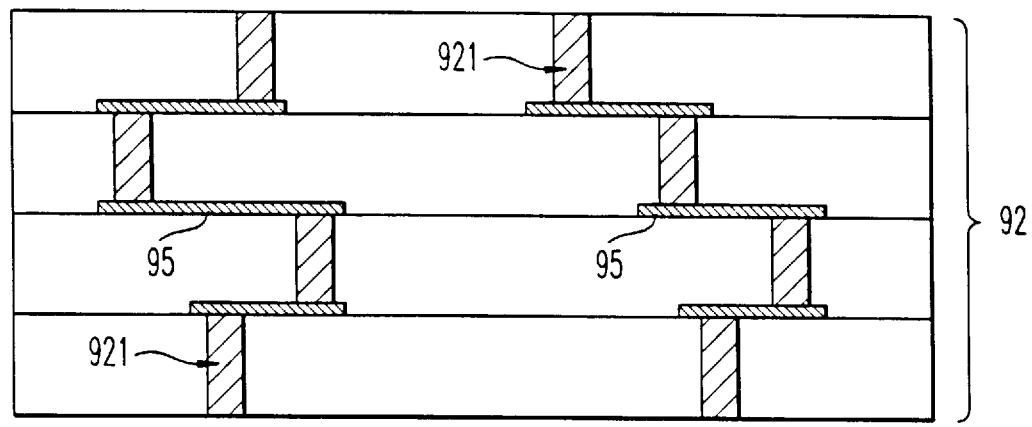
FIG. 12 is a cross section of a sintered ceramic substrate of a prior art.
Figure 13:
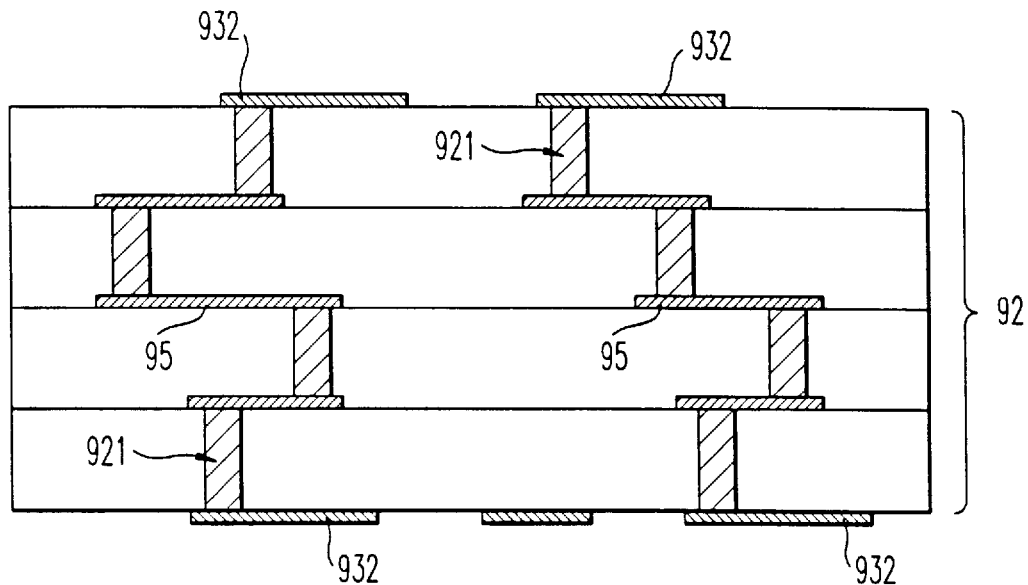
FIG. 13 is a cross section of the sintered ceramic substrate after printing the paste for forming the circuit pattern as a prior art.
Figure 14:
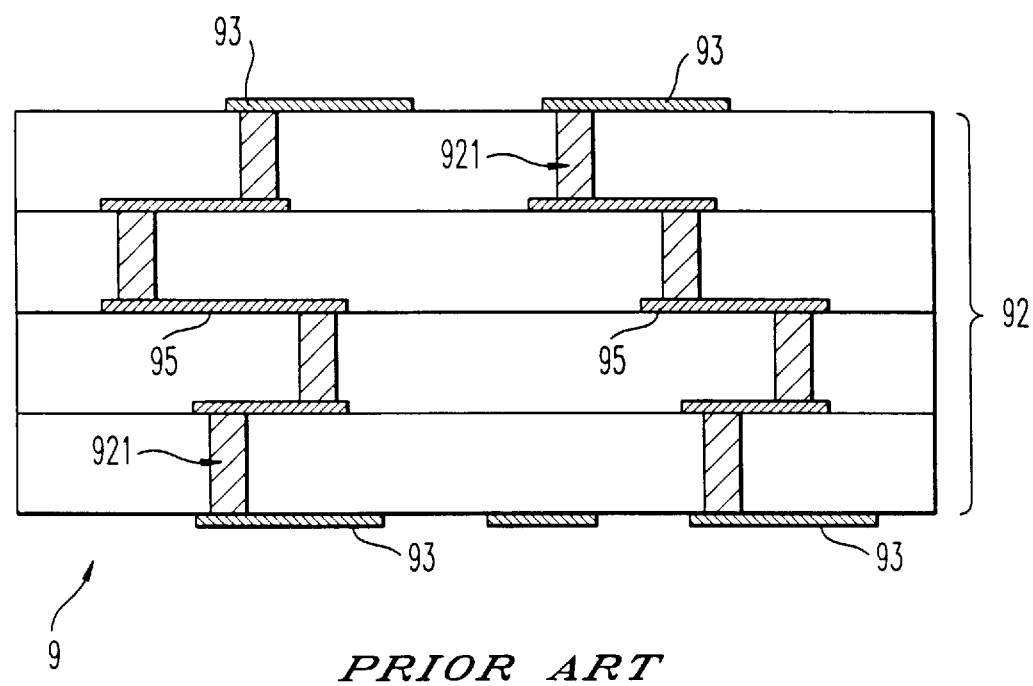
FIG. 14 is a cross section of the ceramic circuit substrate of a prior art.
Figure 15:
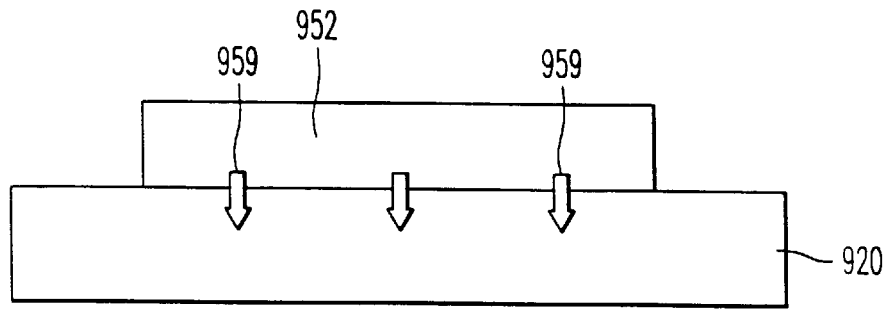
FIG. 15 is an explanatory view showing a cross section of the ceramic green sheets having the paste for forming the inner layer pattern printed thereon as a prior art.
Figure 16:
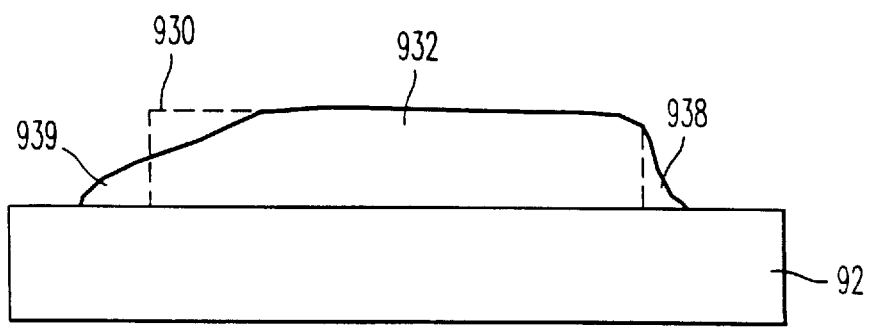
FIG. 16 is an explanatory view showing a cross section of the sintered ceramic substrate having the paste for forming the circuit pattern printed thereon for burning as a problem of a prior art.

Referring to FIGS. 1 and 10, a ceramic circuit substrate of examples of the present invention is described.

As FIG. 1 shows, a ceramic circuit substrate 7 is formed of a sintered ceramic substrate 2 containing glass and a circuit pattern 3 printed on a surface thereof. A porous alumina layer 1 having a thickness of 10 $\mu$m or less is formed between the sintered ceramic substrate 2 and the circuit pattern 3.

Figure 2:
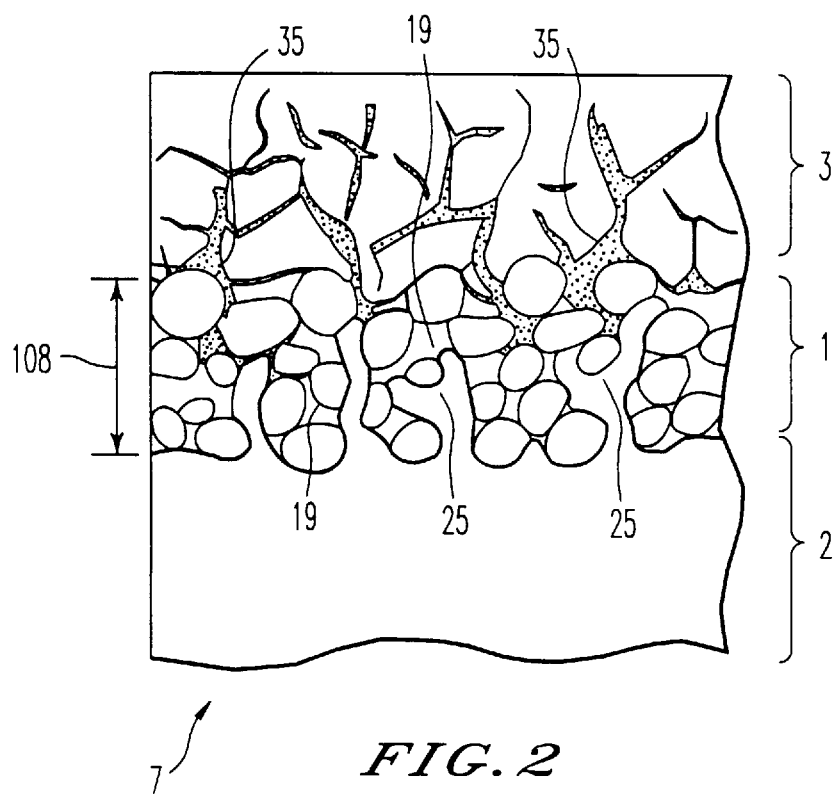
FIG. 2 is a cross section of an upper surface section of the ceramic circuit substrate of Example 1.

As FIG. 2 shows, inside of the porous alumina layer 1 is filled with glass 25 that has been contained in the sintered ceramic substrate 2. The inside of the porous alumina layer is also filled with glass 35 contained in the circuit pattern 3 that has entered from the side opposite to the glass 25.

The sintered ceramic substrate 2 has an inner layer pattern 52 and a via hole 21 filled with a conductor 51.

A method of producing the aforementioned ceramic circuit substrate is briefly described referring to FIGS. 3(a) to 3(e).

Figure 3A:
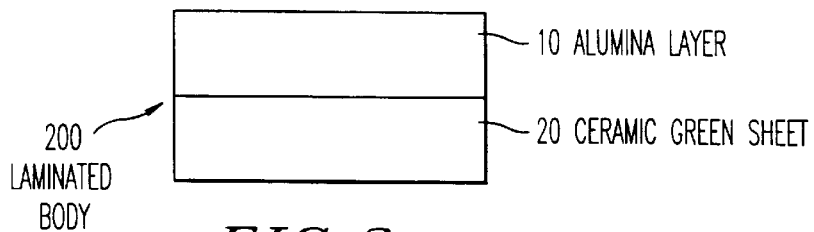
FIGS. 3(a) to (e) briefly represent processes in a method of producing the ceramic circuit substrate of Example 1.

As FIG. 3(a) shows, a laminated body 200 is formed by applying an alumina layer 10 that is green containing an alumina that is not sintered at a temperature ranging from 800° to 1000° C. on a surface of the ceramic green sheet 20 containing glass. An alumina sheet is used for preparing the alumina layer 10.

Figure 3B:
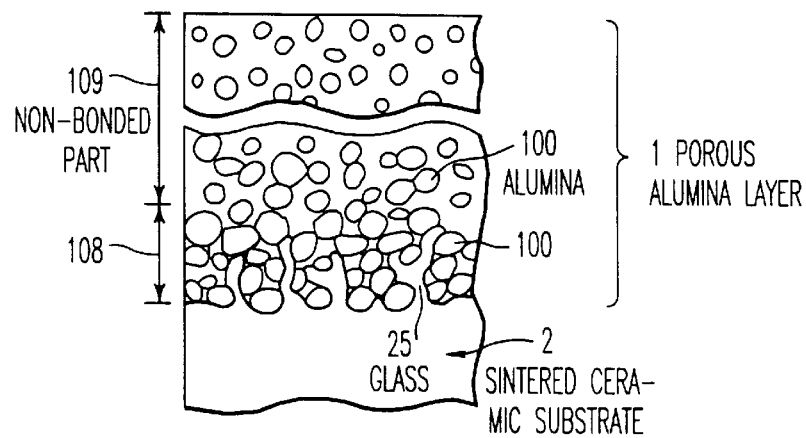

The laminated body 200 is fired at 900° C. As shown in FIG. 3(b), a sintered ceramic substrate 2 is obtained resulted from sintering the ceramic green sheet 20. The alumina layer 10 is formed into a porous alumina layer 1. The glass 25 contained in the sintered ceramic substrate 2 flows to the inside of the porous alumina layer 1 so as to bond the part of the porous alumina layer 1 filled with the glass to the sintered ceramic substrate 2.

Figure 3C:
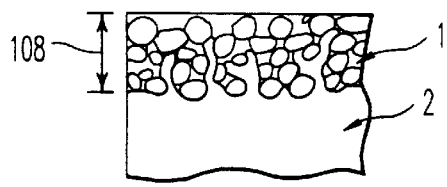

As FIG. 3(c) shows, a non-bonded part 109 of the porous alumina layer 1 that has not been bonded to the sintered ceramic substrate 2, i.e., alumina 100, is removed. A bonded part 108 of the porous alumina layer 1 that has been bonded to the sintered ceramic substrate 2 is remained.

Figure 3D:
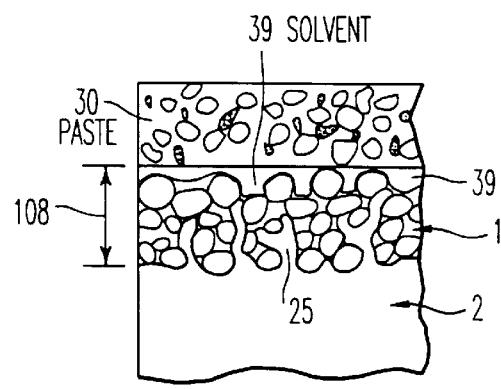

As FIG. 3(d) shows, a paste 30 for forming the circuit pattern is printed on a surface of the porous alumna layer 1 that has been bonded to the sintered ceramic substrate 2. The solvent 39 contained in the paste 30 is absorbed by the porous alumina layer 1.

Figure 3E:
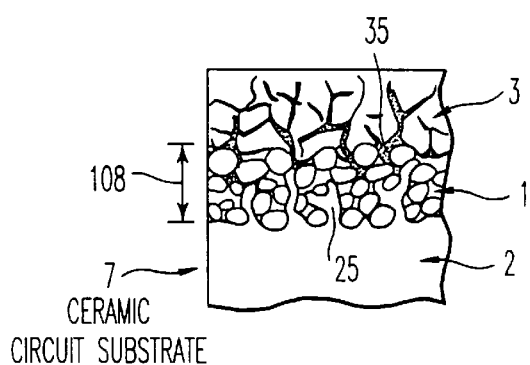

Referring to FIG. 3(e), the circuit pattern 3 is adhered to the sintered ceramic substrate 2 with the aide of the porous alumina layer 1 through heating the sintered ceramic substrate.

The aforementioned method of producing the ceramic circuit substrate is further described in detail.

Binder, plasticizer and solvent are mixed with a solid material obtained by mixing 60 wt. % of $CaO$—$Al_2O_3$—$SiO_2$—$B_2O_3$ glass and 40 wt. % of alumina for kneading. The obtained product is molded through a doctor blade method to form a ceramic green sheet having a thickness of 0.3 mm.

Figure 4:
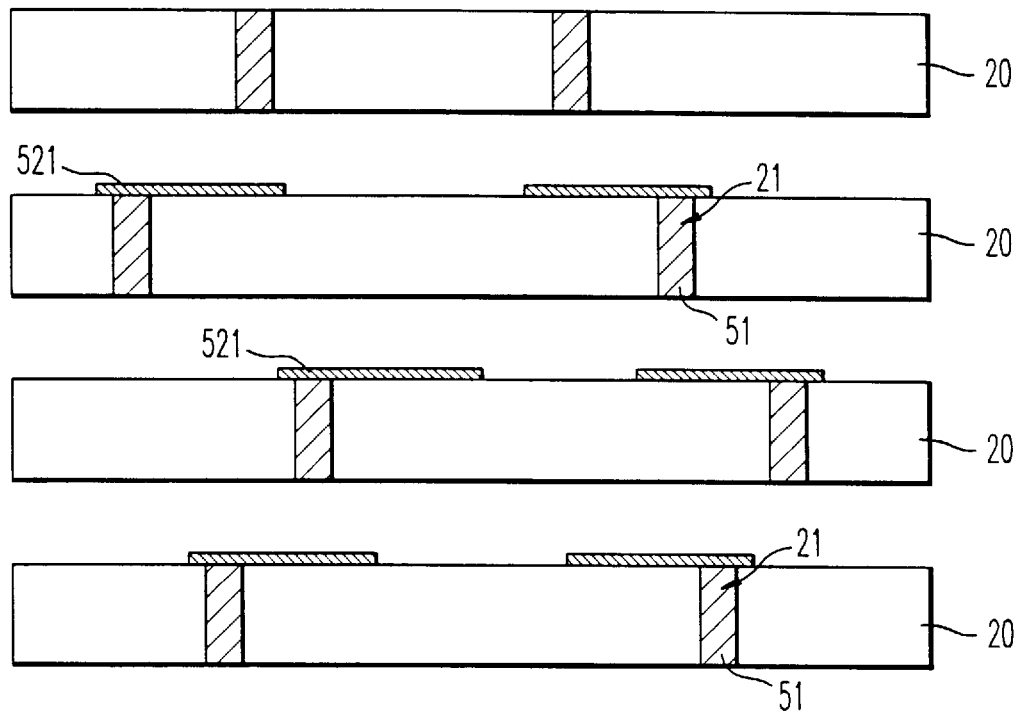
FIG. 4 is a cross section of ceramic green sheets of Example 1.
Figure 5:
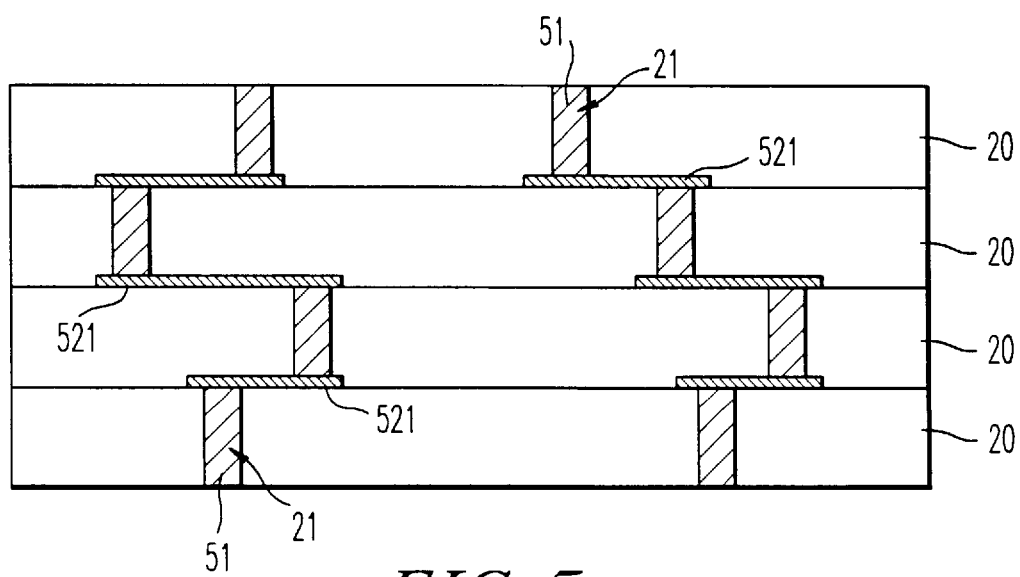
FIG. 5 is a cross section of laminated ceramic green sheets of Example 1.

As FIG. 4 shows, via holes 21 are pierced through the ceramic green sheet 20. A conductor 51 is filled with the via hole 21 through a printing method. A paste 521 for forming an inner layer pattern is printed on a surface of the ceramic green sheet 20. A conductor formed of Ag is used for the conductor 51 and the paste 521. As FIG. 5 shows, the ceramic green sheets 20 are laminated.

An alumina sheet having a thickness of 0.3 mm is formed by mixing the binder, plasticizer and solvent with the solid material containing 90 wt. % of alumina powder for kneading through a doctor blade method.

Figure 6:
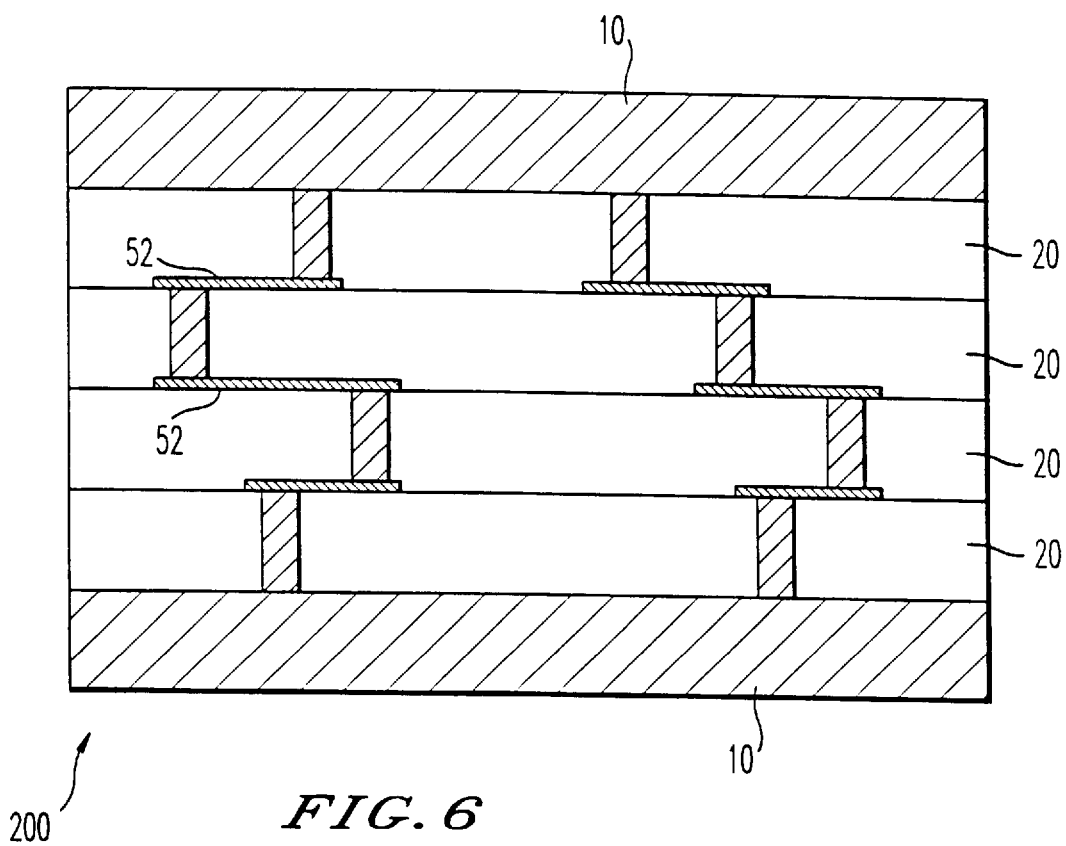
FIG. 6 is a cross section of a laminated body of ceramic green sheets having its surface applied with an alumina layer in Example 1.

As FIG. 6 shows, each surface of the laminated ceramic green sheets 20 is applied with the above obtained alumina sheet as an alumina layer 10, thus forming the laminated body 200.

The laminated body 200 is thermo-compressed at 100° C. under 100 kg/cm$^2$. Then the resultant laminated body 200 is fired in the air at 900° C. for 20 minutes.

Figure 7:
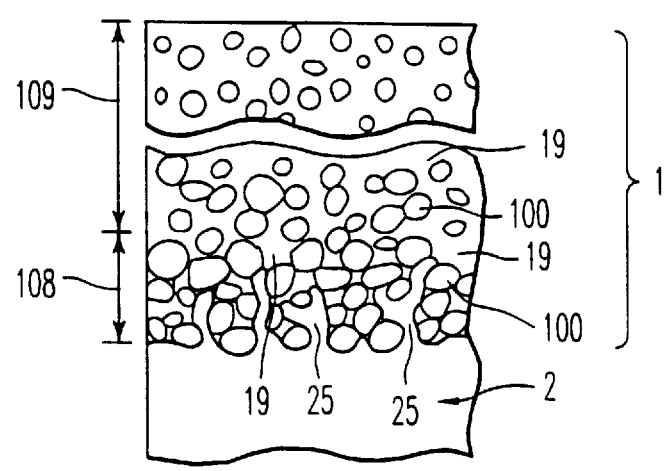
FIG. 7 is a cross section of a sintered ceramic substrate and a porous alumina layer after burning in Example 1.

As FIG. 7 shows, the ceramic green sheet is fired and then formed into a sintered ceramic substrate 2. An alumina layer has a large number of pores 19 formed among aluminas 100. Those pores are filled with the glass 25 that has been contained in the sintered ceramic substrate 2. The lower part of the porous alumina layer 1 filled with the glass is bonded to the sintered ceramic substrate 2. This part is referred to as the bonded part 108. While the upper part of the porous alumina layer 1 is not filled with the glass and becomes the non-bonded part 109 that is not bonded to the sintered ceramic substrate 2.

An inner layer pattern 52 is formed within the sintered ceramic substrate 2.

Figure 8:
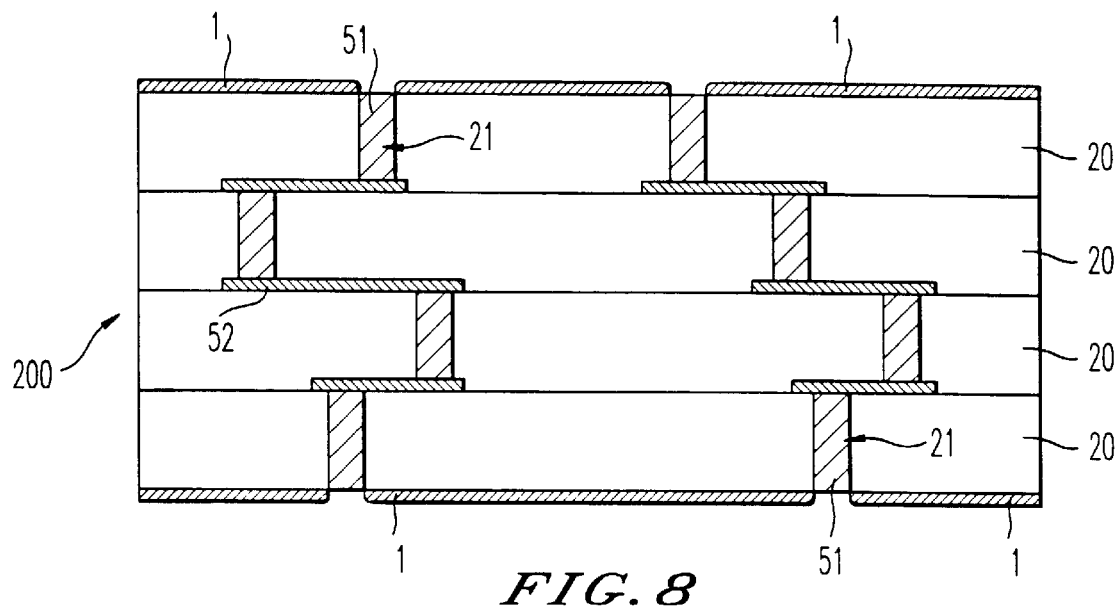
FIG. 8 is a cross section of a sintered ceramic substrate having the porous alumina layer bonded thereto in Example 1.

As FIGS. 7 and 8 show, the non-bonded part 109 of the porous alumina layer 1 is manually removed. The surface of the bonded part 108 of the porous alumina layer 1 is buffed for smoothing the surface. A thickness of the remained bonded part 108 of the porous alumina layer 1 measures about 2 μm.

Figure 9:
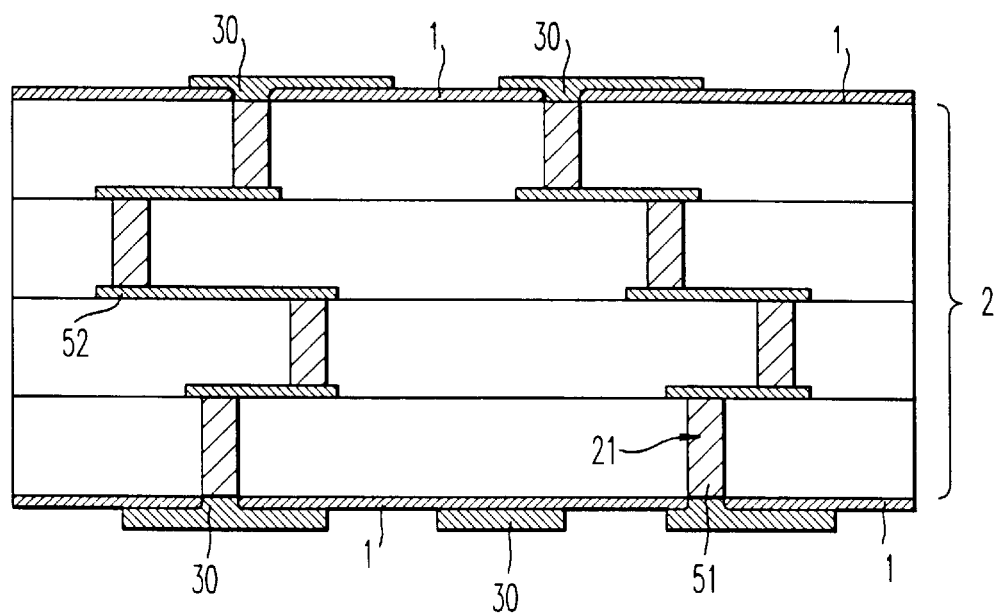
FIG. 9 is a cross section of the sintered ceramic substrate after printing a paste for forming the circuit pattern in Example 1.

As FIGS. 9 and 10 show, the paste 30 for forming the circuit pattern is printed on a surface of the porous alumina layer 1. As shown in FIG. 10, the paste 30 contains Au conductor 31 and glass frit 350. A printing width of the paste 30 is set to 200 μm. A space between adjacent paste lines is set to 120 μm.

Then another type of paste containing Ag and Pd other than the paste 30 containing Au is printed.

The resultant product is fired in the air at 900° C. for 10 minutes. The circuit pattern 3 is formed from the paste line as shown in FIG. 1. The glass frit contained in the circuit pattern 3 is melted and flows into the pores 19 of the porous alumina layer 1. The circuit pattern 3 can be tightly adhered by the anchor effect. As a result, the ceramic circuit substrate 7 is obtained having the circuit pattern 3 firmly adhered to the sintered ceramic substrate 2 with the aid of the porous alumina layer 1.

Example 2

A method of producing the ceramic circuit substrate of Example 2 is the same as Example 1 except that an alumina paste is used as the alumina layer instead of using the alumina sheet.

The alumina paste is obtained by mixing binder, plasticizer and solvent with the solid material containing 90 wt. % or more of alumina powder, which is kneaded into paste. The resultant alumina paste is printed on a surface of the ceramic green sheet and then dried. Then the alumina layer having a thickness ranging from 7 to 10 μm is formed.

The obtained alumina layer is thermo-compressed and fired so as to form a sintered ceramic substrate by sintering the ceramic green sheet. The alumina paste is formed into the porous alumina layer. The alumina part of the porous alumina layer not bonded to the sintered ceramic substrate is removed. The remained bonded part of the porous alumina layer has a thickness of 3 μm or less.

The paste for forming the circuit pattern is applied on a surface of the porous alumina layer as the bonded part, which is further fired. Finally the ceramic circuit substrate of the present invention is produced. Other features are the same as those of Example 1.

Comparative Example

In this Comparative Example, the ceramic circuit substrate is produced without using the alumina layer.

More specifically, the ceramic circuit substrate is produced by printing the paste for forming the circuit pattern directly on a surface of the sintered ceramic substrate for firing. Other features are the same as those of Example 1.

Experiment

In this Experiment, each ceramic circuit substrate of Example 1, Example 2 and Comparative Example was subjected to measurement with respect to a line width of the circuit pattern, line space, wire bonding ability, soldering wettability and adhesion strength, respectively.

As described above, values of the line width of Au and the line space of the circuit pattern were set to 200 μm and 120 μm, respectively.

In order to measure the wire bonding ability (hereinafter referred to as "W/B"), the Au line (diameter: 25 μm) was bonded to a surface of the circuit pattern through USTC (Ultra Sonic Thermo Compression) bonding method. Then the bonding condition between the circuit pattern and the Au line was evaluated with the tension gauge. If the bonding strength becomes 4 g or more, the W/B is determined as "good". If the bonding strength becomes less than 4 g or the wire is peeled off, the W/B is determined as "no good".

In order to measure the soldering wettability, the rosin flux was applied on a surface of the circuit pattern formed of Ag/Pd. Then the solder containing 60 wt. % of tin and 40 wt. % of lead was printed for soldering through heating at 230° C. for 5 seconds. The soldering condition was observed with an optical microscope (×10). If the wetted part is 90% or more of the surface area of the circuit pattern, the soldering wettability is determined as "good". If the wetted part is less than 90% of the surface area of the circuit pattern, it is determined as "no good".

The adhesion strength between the circuit pattern and the sintered ceramic substrate was measured using soldering peel method.

For the aforementioned measurement, the ceramic circuit substrate having the circuit pattern (2 mm×2 mm) formed of Ag/Pd was prepared using the method of the present invention. Then a wire (soft copper wire with a diameter of 0.6 mm) was soldered to the circuit pattern formed on the ceramic circuit substrate. The wire set to the measurement equipment was stretched in a direction at 90° for peeling. The load exerted at a time when peeling occurred was divided by the circuit pattern area. The obtained result (kg/mm$^2$) was defined as the adhesion strength.

This measurement was repeated 20 times.

The measurement results are shown in Table 1.

As shown in Table 1, the error was hardly found in the line width and the line space of the paste for forming the circuit pattern at printing both in Examples 1 and 2 compared with the Comparative Example. The Examples 1 and 2 succeeded in printing, providing sharp line and hardly causing stain and bleed on the line.

The measurement of W/B, soldering wettability and adhesion strength of the circuit pattern of the respective Examples provided approximately similar results.

As FIG. 10 shows, the porous alumina layer 1 is formed of a large number of particle-like aluminas 100 and a large number of pores 19 formed thereamong. When printing the paste 30 for forming the circuit pattern, sufficient amount of the solvent contained in the paste 30 can be absorbed. Therefore the sharp printing line can be formed both in Example 1 and Example 2.

As FIGS. 3(b) and 7 show, upon firing the ceramic green sheet, the glass 25 contained therein is melted and flows into the pores 19 of the porous alumina layer 1.

Then as FIGS. 3(e) and 2 show, upon firing the sintered ceramic substrate 2 after applying the paste for forming the circuit pattern, the glass 35 contained in the paste for forming the circuit pattern is melted and flows to the inside of the porous alumna layer 1. The circuit pattern 3 is tightly adhered to the porous alumna layer 1 with the anchor effect resulted from the flow of the glass 35 into the porous alumina layer 1.

Therefore the adhesion strength between the porous alumina layer 1 and the sintered ceramic substrate 2 is increased. Likewise the adhesion strength between the circuit pattern 3 and the porous alumina layer 1 is also increased.

The present invention provides a method of producing the ceramic circuit substrate having a sharp and fine circuit pattern as well as having the circuit pattern tightly adhered to the sintered ceramic substrate.

While the invention has been described with reference to the examples, it is to be understood that modifications or variations may be easily made by a person of ordinary skill in the art without departing from the scope of this invention which is defined by the appended claims.

TABLE 1

|  | Line width (μm) | Line space (μm) | W/B | Soldering wettability | Adhesion strength (kg/mm²) |
| --- | --- | --- | --- | --- | --- |
| Example 1 | $\bar{X}$ 198 σ4 | $\bar{X}$ 121 σ4 | Good | Good | $\bar{X}$1.0min0.7 |
| Example 2 | $\bar{X}$ 206 σ6 | $\bar{X}$ 114 σ6 | Good | Good | $\bar{X}$1.0min0.6 |
| Comparative Example | $\bar{X}$228 σ11 | $\bar{X}$ 91 σ12 | good | Good | $\bar{X}$1.1min0.6 |

$\bar{X}$: Average value
σ: Standard deviation
min.: Minimum value

What is claimed is:

1. A method of producing a ceramic circuit substrate comprising:

preparing a laminated body by applying an alumina layer that is green containing an alumina that is not sintered at a temperature ranging from 800° to 1000° C. to a surface of a ceramic green sheet containing glass that is sintered at a temperature ranging from 800° to 1000° C.;

forming a sintered ceramic substrate by sintering said ceramic green sheet and forming said alumina layer into a porous alumina layer through firing said laminated body at a temperature ranging from 800° to 1000° C.; and causing said glass to flow into said porous alumina layer so as to bond a part of said porous alumina layer filled with said glass to said sintered ceramic substrate;

removing an alumina part of said porous alumina layer that has not been bonded to a surface of said sintered ceramic substrate;

printing a paste for forming a circuit pattern on a surface of said porous alumina layer; and adhering said circuit pattern to said sintered ceramic substrate with the aid of said porous alumina layer by firing said sintered ceramic substrate;

wherein said porous alumina layer remaining on said sintered ceramic substrate after the removing of said alumina part has a thickness of 10 μm or less.

2. The method of producing a ceramic circuit substrate of claim 1, wherein said alumina layer is an alumina sheet.

3. The method of producing a ceramic circuit substrate of claim 1, wherein said alumina layer is formed by drying a printed alumina paste.

4. The method of producing a ceramic circuit substrate of claim 1, wherein said paste for forming a circuit pattern contains glass frit.

* * * * *